(12) United States Patent
Yang et al.

(10) Patent No.: US 11,303,358 B2
(45) Date of Patent: Apr. 12, 2022

(54) OPTICAL TRANSMITTER INCLUDING A GRADED OR SLOPED PASSBAND FILTER, AND METHODS OF MAKING AND USING THE SAME

(71) Applicant: Source Photonics, Inc., West Hills, CA (US)

(72) Inventors: Jian Yang, West Hills, CA (US); Chao Tian, West Hills, CA (US); Shengzhong Zhang, West Hills, CA (US); Jingmao Chi, West Hills, CA (US)

(73) Assignee: Source Photonics, Inc., West Hills, CA (US)

( * ) Notice: Subject to any disclaimer, the term of this patent is extended or adjusted under 35 U.S.C. 154(b) by 892 days.

(21) Appl. No.: 16/069,493

(22) PCT Filed: Jun. 28, 2018

(86) PCT No.: PCT/US2018/040024
§ 371 (c)(1),
(2) Date: Jul. 11, 2018

(87) PCT Pub. No.: WO2020/005256
PCT Pub. Date: Jan. 2, 2020

(65) Prior Publication Data
US 2021/0210926 A1    Jul. 8, 2021

(51) Int. Cl.
*H01S 5/00* (2006.01)
*H04B 10/50* (2013.01)
(Continued)

(52) U.S. Cl.
CPC ....... *H04B 10/50575* (2013.01); *H01S 5/005* (2013.01); *H01S 5/02469* (2013.01); *H01S 5/4012* (2013.01); *H04B 10/504* (2013.01)

(58) Field of Classification Search
CPC .. H01S 3/005; H01S 3/10023; H01S 5/02469; H01S 5/4012; H01S 5/005;
(Continued)

(56) References Cited

U.S. PATENT DOCUMENTS 5,583,683 A * 12/1996 Scobey .............. G02B 6/29367
398/79
2005/0025483 A1* 2/2005 Gurevich .............. H04B 10/40
398/68

(Continued)

OTHER PUBLICATIONS

International Search Report and Written Opinion; PCT International Searching Authority/US dated Sep. 19, 2018, International Application No. PCT/US2018/040024; 8 pages; International Searching Authority/United States, Commissioner for Patents, Alexandria, Virginia.

(Continued)

*Primary Examiner* — Xinning (Tom) Niu
(74) *Attorney, Agent, or Firm* — Andrew D. Fortney; Central California IP Group, P.C.

(57) ABSTRACT

Embodiments pertain to an optical transmitter, including a thermally unregulated light emitting device and a sloped or graded passband filter. The light emitting device is configured to receive a bias current and output an optical signal within a wavelength band. The sloped or graded passband filter is configured to attenuate an output power of the optical signal in the wavelength band. The light emitting device has a maximum bias current limit, a maximum operating temperature limit, and maximum and minimum output power limits, and the sloped or graded passband filter has an insertion loss in the wavelength band that decreases as the light emitting device temperature increases and/or the optical signal wavelength increases within the wavelength band. The attenuated optical signal is within the maximum and minimum output power limits when the bias current is at or (Continued)

below the maximum bias current limit and the light emitting device outputs the optical signal at or below the maximum operating temperature limit.

17 Claims, 6 Drawing Sheets

(51) Int. Cl.
*H01S 5/024* (2006.01)
*H01S 5/40* (2006.01)

(58) Field of Classification Search
CPC .. H01S 5/02325; H01S 5/0071; H01S 5/4087; H04B 10/50575; H04B 10/504
See application file for complete search history.

(56) References Cited

U.S. PATENT DOCUMENTS

| | | |
|---|---|---|
| 2005/0185898 A1 | 8/2005 | Stewart |
| 2007/0036495 A1* | 2/2007 | Murry ................ H01S 5/02251 385/92 |
| 2007/0268943 A1 | 11/2007 | Tatum |
| 2010/0092184 A1 | 4/2010 | Nguyen et al. |

OTHER PUBLICATIONS

International Preliminary Report on Patentability dated Jan. 7, 2021; International Application No. PCT/US2018/040024; International Filing Date: Jun. 28, 2018; 7 pages; The International Bureau of WIPO, Geneva, Switzerland.

* cited by examiner

OPTICAL TRANSMITTER INCLUDING A GRADED OR SLOPED PASSBAND FILTER, AND METHODS OF MAKING AND USING THE SAME

FIELD OF THE INVENTION

The present invention relates to the field of optical or optoelectronic transmitters, and particularly continuous optical or optoelectronic transmitters and/or unmodulated optical or optoelectronic transmitters without a temperature control mechanism. In accordance with the present invention, such transmitters can include a graded or sloped passband filter.

DISCUSSION OF THE BACKGROUND

Optical or optoelectronic transceivers (which may be generally identified as "optical transceivers") convert electrical signals into optical signals and optical signals into electrical signals. An optical transceiver may include receiver and transmitter optical subassemblies, functional circuits, and electrical and optical interfaces, and are significant components in optical fiber communication systems and data storage networks.

Figure 1:
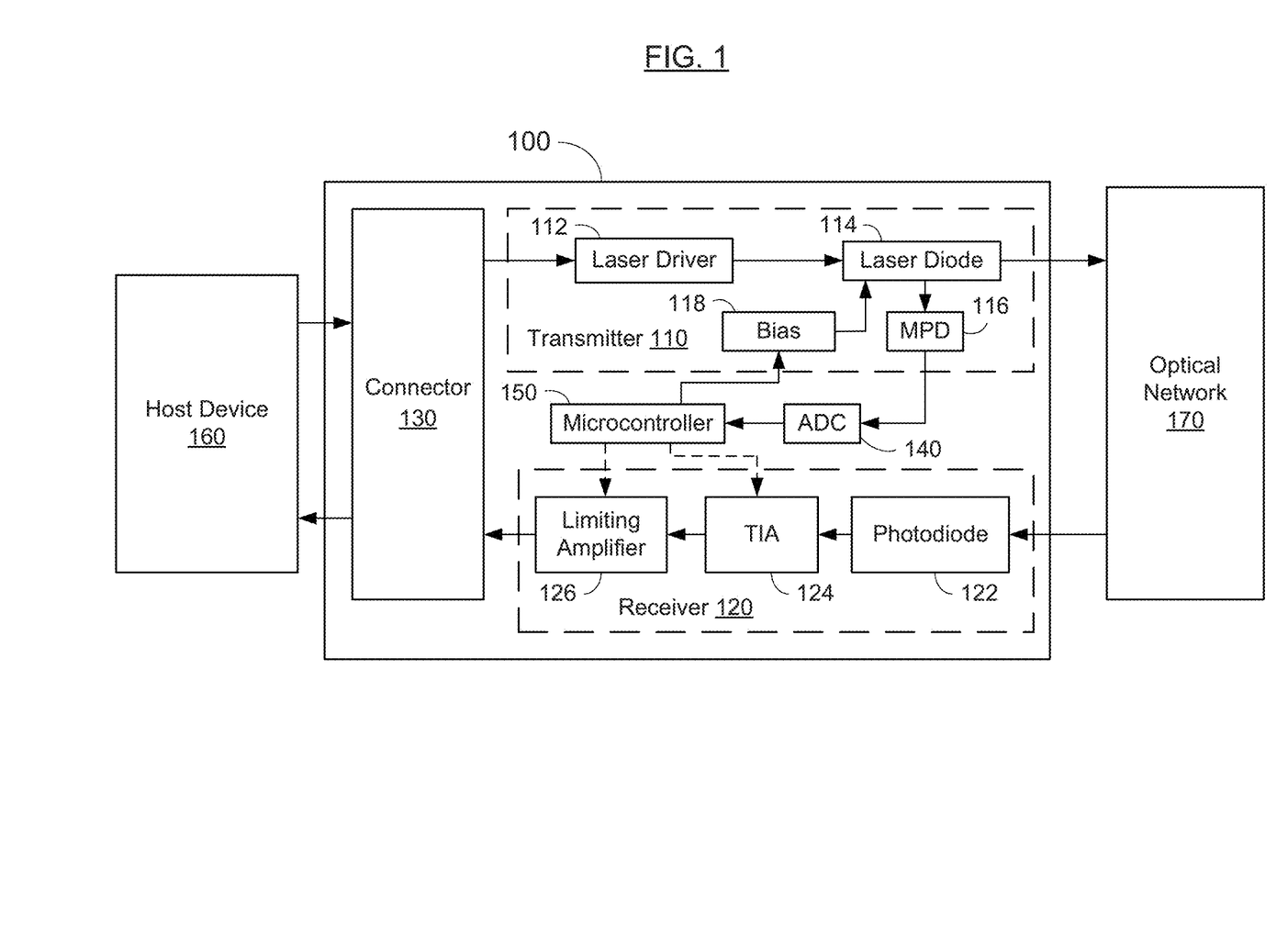
FIG. 1 is a block diagram showing a conventional optical transceiver communicating with a host device and an optical network.

FIG. 1 shows a conventional architecture for an optical transceiver 100. The optical transceiver 100 includes a transmitter 110, a receiver 120, an electrical connector 130, an analog-to-digital converter (ADC) 140, and a microcontroller 150. The transmitter includes a laser driver 112, a laser diode or other light-emitting device 114, a monitoring photodiode (MPD) 116, and a bias circuit 118 configured to apply a bias current or bias voltage to the laser diode 114. The bias circuit 118 (or a different bias circuit) may also apply a bias current or bias voltage to the laser driver 112. The receiver 120 includes a photodiode 122, a transimpedance amplifier 124, and a limiting amplifier 126.

In operation, the optical transceiver 100 receives electrical signals from a host device 160 through the connector 130, which functions as an electrical interface with the host device 160. Electrical data signals are received by the laser driver 112, which provides a laser driving signal to the laser diode 114. The laser diode 114 converts the laser driving signal to an optical data signal that is transmitted to an optical network 170 on an optical fiber. The MPD 116 samples the optical signal (or other light output) from the laser diode 114, and the ADC 140 converts the analog value of the laser diode signal strength from the MPD 116 for processing by the microcontroller 150. When the signal strength is below a lower threshold (i.e., below an acceptable or desired output signal strength range for the laser diode 114), the microcontroller 150 increases the bias current or bias voltage from the bias circuit 118 to the laser diode 114. When the signal strength is above an upper threshold (i.e., above the acceptable or desired output signal strength range for the laser diode 114), the microcontroller 150 decreases the bias current or bias voltage from the bias circuit 118 to the laser diode 114.

On the receiver side, the photodiode 112 receives optical signals from optical network 170 on an optical fiber and converts the optical signals to electrical signals. The TIA 124 amplifies the electrical signals from the photodiode 112, and the limiting amplifier 126 further amplifies the amplified electrical signal from the TIA 124 for transmission through the connector 130 to the host device 160. In some cases, the limiting amplifier 126 may also filter or otherwise "shape" the amplified electrical signal from the TIA 124.

In some optical transceivers 100, the laser diode 114 is a directly modulated laser diode (DML) or other light emitting device that does not include a temperature control mechanism such as a thermoelectric cooler (TEC). In the case of DMLs, they generally provide optical signals with high output power. In some cases, the output power of the optical signal is about twice as intense as that from a similar electromodulated laser (EML) chip. However, the center wavelength of the optical signal from a DML red-shifts as the temperature of the DML increases. Frequently, this red-shift is on the order of 1 nm per 10° C. of temperature increase. Similarly, the center wavelength of the optical signal from a DML blue-shifts as the temperature of the DML decreases.

Figure 2:
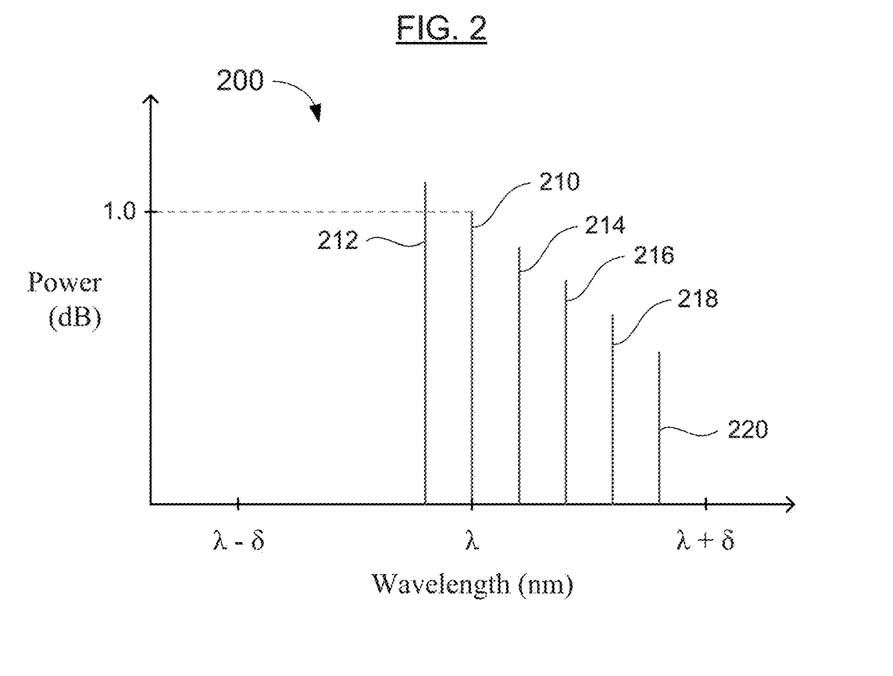
FIG. 2 is a graph showing the output power and wavelength of light emitted by a conventional directly modulated laser (DML) at various operating temperatures.

Also, the output power of the optical signal from a DML decreases as temperature of the DML increases. In some cases, the output power decreases by about 3 dB as the DML temperature increases from 25° C. to 70° C. (at a constant current to the laser diode 114). For example, FIG. 2 is a graph showing the output power and wavelength of an optical beam from a conventional DML as a function of temperature. Typically, the DML outputs light at the center wavelength λ of a wavelength band (λ−δ) to (λ+δ) at room temperature (e.g., 25° C.). The output power 210 at the center wavelength λ may be normalized at a relative value of 1.0. At lower temperatures (e.g., 10° C.), the output power 212 increases, and the wavelength decreases. For example, the output wavelength may decrease by 1-1.5 nm, and the output power 212 may increase by 10-15%. At higher temperatures, the respective output power 214-220 may decrease linearly or substantially linearly, as the wavelength increases linearly or substantially linearly. For example, at 40° C., the output power 214 may decrease by 10-15% (e.g., to a relative value of 0.85-0.90), while the output wavelength increases by 1-1.5 nm. The same or similar output power decreases and wavelength increases may occur as the temperature continues to increase (e.g., to 55° C. at 216, 70° C. at 218, and 85° C. at 220 (although a safe upper temperature limit for many DMLs may be 70° C.). At 218 and 220, the output power may be about half or less than half of the output power 210 at room temperature, and the wavelength may be red-shifted close to or at the upper limit (λ+δ) of the acceptable output wavelength band.

Figure 3:
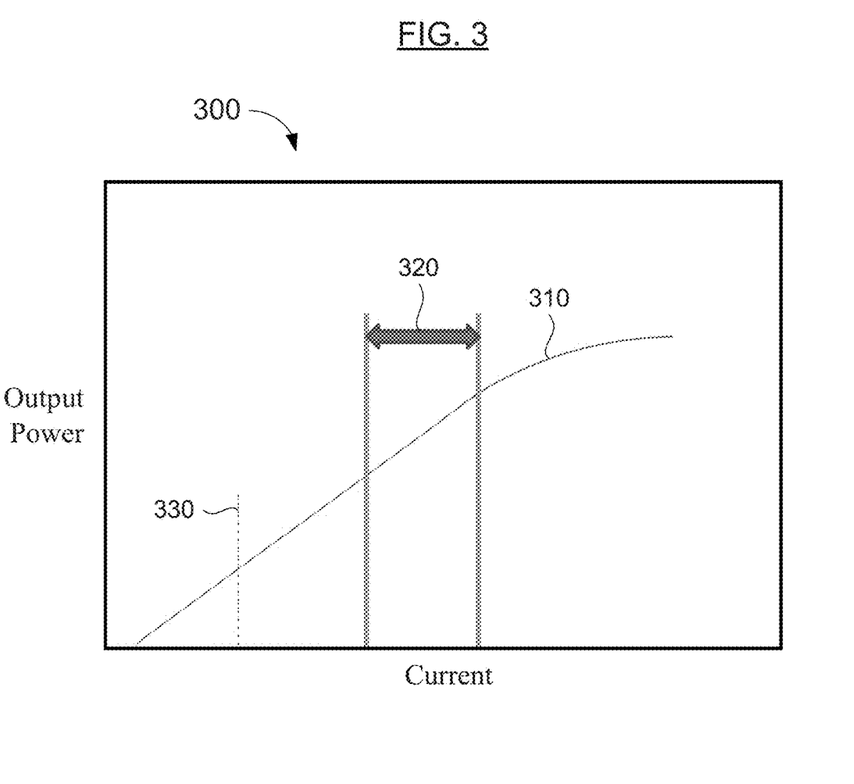
FIG. 3 is a graph showing the output power of a conventional DML as a function of applied current, including an ideal operating current for the DML.

FIG. 3 is a graph 300 showing a curve 310 of the light output power from a typical or conventional DML as a function of the current applied to the DML. An ideal current range 320 may be, for example, an uppermost linear or substantially linear part of the curve 310. In a typical or conventional DML, this ideal working current range may be 35-50 mA. Above 50 mA, the reliability of the DML (or its output) is unacceptable, and as a result, the DML is not usable in this range. A typical minimum working current 330 may be about 15 mA (but only at low temperature, such as room temperature or less). Below a working current of 15 mA, the DML is not usable, as the bandwidth of the output signal is too low (e.g., to be reliably detected).

One challenge in making a reliable optical transmitter with a DML is that the optical output power is generally too high when the DML is operated in the usable current range 320 at temperatures in the low end of the operating temperature range of the DML. Two attempted solutions to this problem include (1) defocusing the lens in front of the optical fiber and (2) decreasing the power of the optical signal from the DML an optical attenuator. However, defocusing the lens in front of the optical fiber introduces a potentially uncontrollable tracking error, and adding an optical attenuator to the system increases the cost of the optical transmitter.

Figure 4:
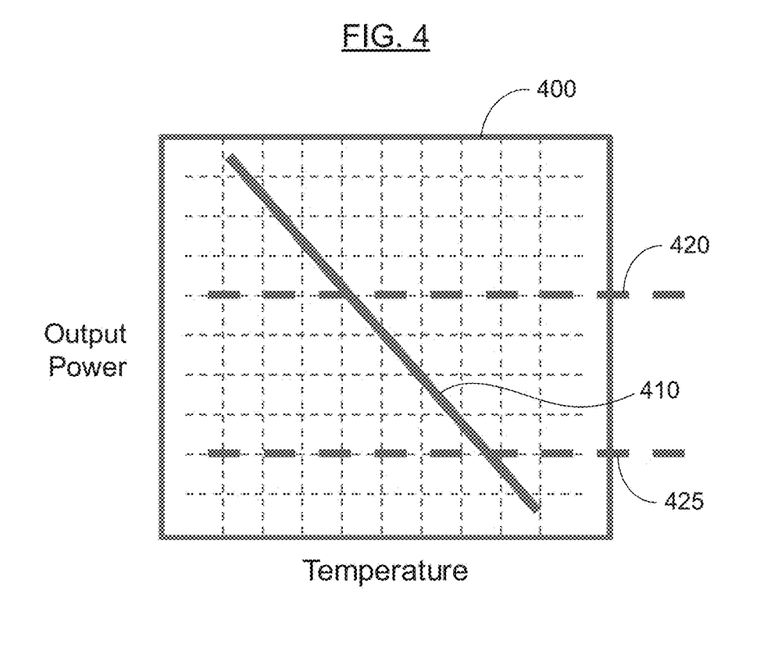
FIG. 4 is a graph showing the output power of the conventional DML as a function of temperature, including specified upper and lower limits of the laser output power.

Another possible solution is to try to take advantage of the characteristic of DMLs in which the output power decreases as a function of temperature. For example, FIG. 4 is a graph 400 showing a curve 410 of the output power of an idealized DML as a function of temperature at a constant or fixed current. As the temperature of the DML increases, the output power of the DML decreases. Ideally, this decrease in output power as a function of increasing temperature is linear or substantially linear.

However, the range of DML output power that is useable in most optical networks is relatively small. The curve 410 shows the DML output power over the typical operating temperature range of the TOSA. In the typical case, the output power of the DML at relatively low temperatures exceeds the specified upper limit 420 for the TOSA laser output power, and at relatively high temperatures (where the DML typically operates in continuous use), the output power of the DML is under the specified lower limit 425 for the TOSA laser output power.

Figure 5:
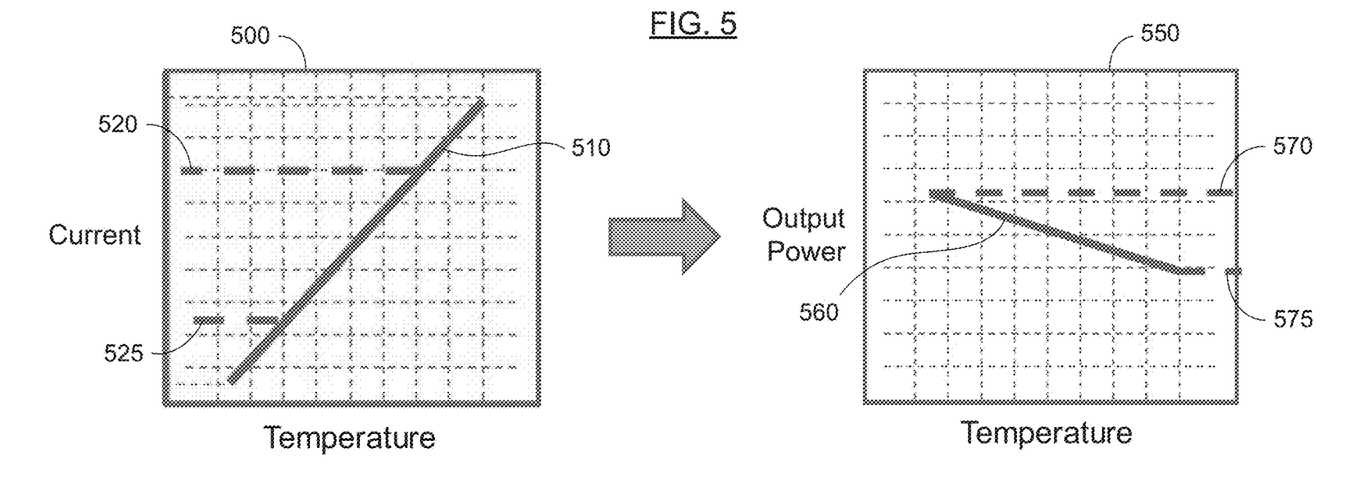
FIG. 5 is two graphs showing one relationship between the bias current applied to a conventional DML and the corresponding output power over a range of operating temperatures (namely, the bias current necessary to keep the output power of a conventional DML within specified acceptable limits).

If the current can be adjusted, then it may be possible to control the current so that the DML output power is within the specified upper and lower limits 320, 325 at relatively low and relatively high temperatures. FIG. 5 shows two graphs 500 and 550 that display curves 510 and 560, respectively, of the current supplied to the DML as a function of temperature (graph 500) and the corresponding DML output power as a function of temperature (graph 550). However, when the DML output power 560 is within the specified upper and lower limits 570 and 575 at high and low temperatures, the current 510 supplied to the DML exceeds the upper current limit 520 at high temperatures and is below the lower current limit 525 at low temperatures.

Figure 6:
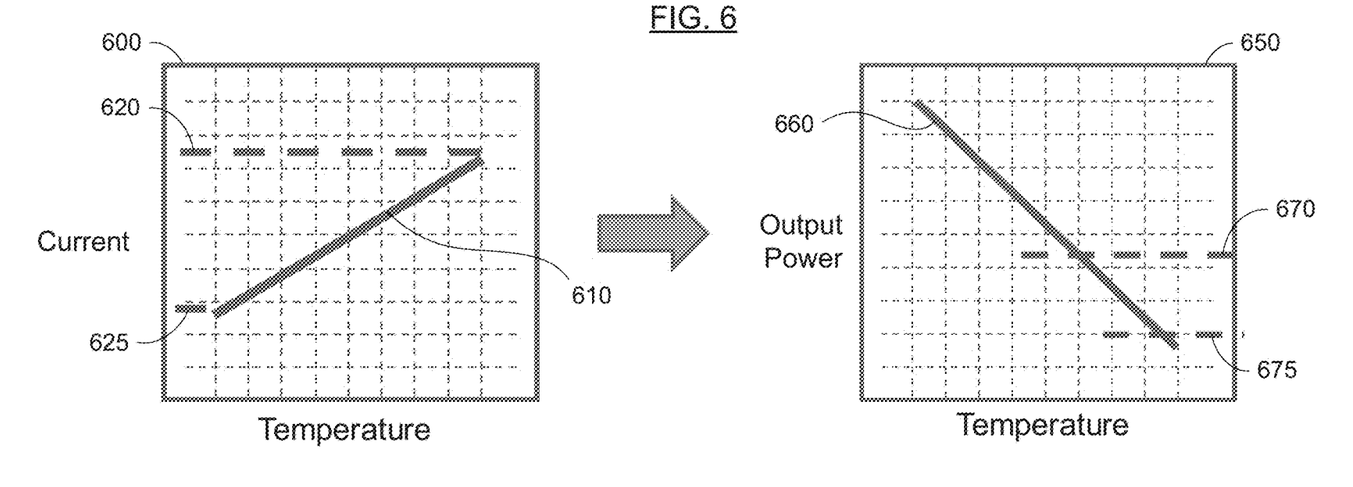
FIG. 6 is two graphs showing another relationship between the bias current applied to the conventional DML and the corresponding output power over the same range of operating temperatures (namely, the effect of keeping the bias current within specified acceptable limits on the output power of the conventional DML).

Similarly, FIG. 6 shows two graphs 600 and 650 that display curves 610 and 660, respectively, of the current supplied to the DML as a function of temperature (graph 600) and the corresponding DML output power as a function of temperature (graph 650). However, in this case, when the current 610 supplied to the DML is within the specified upper and lower limits 620 and 625 at high and low temperatures, the DML output power 660 exceeds the upper limit 670 at temperatures and is below the lower limit 675 at high temperatures. Thus, a need is felt for a solution that enables DMLs and other lasers without active temperature control mechanisms to output an optical signal at a power within specified upper and lower limits, using a bias current within the specified upper and lower limits, while operating the DML or other laser within allowable temperature limits.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

In one aspect, the present invention relates to an optical or optoelectronic transmitter comprising a thermally unregulated light emitting device and a sloped or graded passband filter. The thermally unregulated light emitting device is configured to receive a bias current and output an optical signal within a first wavelength band. The sloped or graded passband filter is configured to receive the optical signal and attenuate an output power of the optical signal in the first wavelength band. The thermally unregulated light emitting device has a maximum bias current limit, a maximum operating temperature limit, and maximum and minimum output power limits, and the sloped or graded passband filter has an insertion loss in the first wavelength band that decreases as (i) a temperature of the thermally unregulated light emitting device increases and/or (ii) a wavelength of the optical signal increases within the first wavelength band, such that the attenuated optical signal is within the maximum and minimum output power limits when (1) the bias current is at or below the maximum bias current limit and (2) the thermally unregulated light emitting device outputs the optical signal at or below the maximum operating temperature limit. The thermally unregulated light emitting device may also have a minimum bias current limit and/or a minimum operating temperature limit, and the attenuated optical signal may be within the maximum and minimum output power limits when (1) the bias current is at or above the minimum bias current limit and (2) the thermally unregulated light emitting device outputs the optical signal at or above the minimum operating temperature limit.

In various embodiments, the first wavelength band has a center wavelength $\lambda$ and a range of from $(\lambda-\delta)$ to $(\lambda+\delta)$, and the insertion loss in the first wavelength band decreases as the wavelength of the optical signal increases within the first wavelength band. The center wavelength $\lambda$ may be from 440 to 200 nm, or any value or range of values therein (e.g., 1100-1600 nm). The variation $\delta$ from the center wavelength $\lambda$ may be from 1 to 25 nm, or any value or range of values therein. The insertion loss may decrease linearly or substantially linearly from $(\lambda-\delta)$ to $(\lambda+\delta)$.

The thermally unregulated light emitting device may comprise a laser diode configured to convert an electrical current or an electrical signal into light. For example, the laser diode may comprise a double heterostructure laser, a separate confinement heterostructure laser, a quantum well laser, a quantum cascade laser, an interband cascade laser, a distributed Bragg reflector laser, a distributed feedback laser, a vertical cavity laser, a vertical-cavity surface-emitting laser [VCSEL], a vertical external-cavity surface-emitting laser [VECSEL], or an external-cavity diode laser. In some embodiments, the laser diode comprises a directly-modulated laser diode (DML). Alternatively, the laser diode may further comprise an external modulator. The external modulator may be electrical, optical, acoustic, or a combination thereof. For example, the combination of the laser diode and the external modulator may comprise an electromodulated laser (EML). In further embodiments, the laser diode may further comprise a polarizer and/or an optical isolator, and the optical or optoelectronic transmitter may further comprise one or more lenses configured to focus the optical signal onto a target (e.g., in or on an end of an optical fiber).

In a further aspect, the invention concerns a multi-channel optical or optoelectronic transmitter, comprising the present optical or optoelectronic transmitter (functioning as a first transmitter unit of the multi-channel optical or optoelectronic transmitter), a second transmitter unit similar or substantially identical to the first transmitter unit, and an optical fiber configured to receive the first and second optical signals. The optical signal from the first transmitter unit is a first optical signal having a first center wavelength within the first wavelength band. The second transmitter unit is similar or substantially identical to the first transmitter unit, and is configured to output a second optical signal having a second center wavelength within a second wavelength band. The first and second center wavelengths differ by a predetermined minimum (e.g., x nm, where x is a number of at least 4), and the first and second wavelength bands do not overlap. The multi-channel optical or optoelectronic transmitter may further comprise (i) an optical fiber configured to receive the first and second optical signals and/or (ii) a beam combiner or an optical multiplexer configured to combine the first and second optical signals.

Some embodiments of the multi-channel optical or optoelectronic transmitter may further comprise (i) a third transmitter unit similar or substantially identical to the first and second transmitter units and (ii) a fourth transmitter unit similar or substantially identical to the first, second and third transmitter units. The third transmitter unit is configured to output a third optical signal having a third center wavelength within a third wavelength band, and the fourth transmitter unit is configured to output a fourth optical signal having a fourth center wavelength within a fourth wavelength band. Each of the first, second, third and fourth center wavelengths differ from an adjacent one of the first, second, third and fourth center wavelengths by at least x nm, and each of the first, second, third and fourth wavelength bands have a wavelength range of less than the difference between adjacent center wavelengths (e.g., less than x nm). The multi-channel optical or optoelectronic transmitter may further comprise an optical multiplexer configured to combine the first, second, third and fourth optical signals.

In various embodiments, each wavelength band has a center wavelength $\lambda_i$ and a range of from $(\lambda_i-\delta)$ to $(\lambda_i+\delta)$, where i is the number of channels and is a series of positive integers of 1 to 2 or more (e.g., 2, 4, 8, 10, 12, etc.). The insertion loss in each wavelength band decreases as the wavelength of the optical signal increases within the wavelength band. As for the optical or optoelectronic transmitter, the insertion loss in each wavelength band may decrease linearly or substantially linearly from $(\lambda_i-\delta)$ to $(\lambda_i+\delta)$.

In another aspect, the present invention relates to a method of controlling an output power of a thermally unregulated light emitting device, comprising generating an optical signal within a wavelength band from the thermally unregulated light emitting device, and passing the optical signal through a sloped or graded passband filter configured to attenuate an output power of the optical signal in the wavelength band. The light emitting device is configured to receive a bias current less than or equal to a maximum bias current limit, and the light emitting device has a maximum operating temperature limit and maximum and minimum output power limits. The sloped or graded passband filter has an insertion loss in the wavelength band that decreases as (i) a temperature of the thermally unregulated light emitting device increases and/or (ii) a wavelength of the optical signal increases within the wavelength band, such that the attenuated optical signal is within the maximum and minimum output power limits when (1) the bias current is at or below the maximum bias current limit and (2) the thermally unregulated light emitting device outputs the optical signal at or below the maximum operating temperature limit. The method may further comprise generating the bias current and providing the bias current to the thermally unregulated light emitting device. The thermally unregulated light emitting device may also have a minimum bias current limit and/or a minimum operating temperature limit, and passing the optical signal through the sloped or graded passband filter may attenuate the optical signal to within the maximum and minimum output power limits when (1) the bias current is at or above the minimum bias current limit and (2) the thermally unregulated light emitting device outputs the optical signal at or above the minimum operating temperature limit.

As described for the optical or optoelectronic transmitter, the wavelength band may have a center wavelength $\lambda$ and a range of from $(\lambda-\delta)$ to $(\lambda+\delta)$, and the insertion loss in the wavelength band may decrease linearly or substantially linearly from $(\lambda-\delta)$ to $(\lambda+\delta)$. The center wavelength $\lambda$ may be from 440 to 2000 nm, or any value or range of values therein, and the variation $\delta$ from the center wavelength $\lambda$ may be from 1 to 25 nm, or any value or range of values therein.

The thermally unregulated light emitting device may comprise a laser diode, and the method may further comprise converting an electrical current or an electrical signal into light using the laser diode. The laser diode may be as described for the optical or optoelectronic transmitter, and in some embodiments, may comprise a directly-modulated laser diode (DML). Alternatively, the thermally unregulated light emitting device may further comprise an external modulator, and the combination of the laser diode and the external modulator may comprise an electromodulated laser (EML). In such embodiments, the method may further comprise providing an electrical driver and/or data signal to the DML or EML. In the case where the thermally unregulated light emitting device comprises the EML or other laser diode-external modulator combination, the method may further comprise modulating the light emitted from the laser diode using the external modulator.

In further embodiments, the method may further comprise (i) passing the output signal (which may be modulated) through a polarizer and/or an optical isolator, (ii) passing the output signal (which may be modulated) through one or more lenses configured to focus the optical signal onto a target (e.g., in or on an end of an optical fiber), and/or (iii) transmitting the modulated, attenuated over an optical transmission medium (e.g., an optical fiber).

In even further embodiments, the method further comprises generating a second optical signal within a second wavelength band from a second thermally unregulated light emitting device, and passing the second optical signal through a second sloped or graded passband filter configured to attenuate an output power of the second optical signal in the second wavelength band, similarly or substantially identically to the method described above, and transmitting the two optical signals over an optical fiber. The second optical signal in the second wavelength band represents a second channel of optical communication (e.g., from a single, multi-channel transmitter or other device including such a transmitter). As for the optical or optoelectronic transmitter, the center wavelengths of the two optical signals differ by a predetermined minimum (e.g., x nm), and the two wavelength bands do not overlap. The method may further comprise combining the two optical signals (e.g., using a beam combiner or an optical multiplexer) prior to transmitting the two optical signals over the optical fiber.

Some embodiments of the method may further comprise (i) generating a third optical signal within a third wavelength band from a third thermally unregulated light emitting device, (ii) passing the third optical signal through a third sloped or graded passband filter configured to attenuate an output power of the third optical signal in the third wavelength band, (iii) generating a fourth optical signal within a fourth wavelength band from a fourth thermally unregulated light emitting device, (iv) passing the fourth optical signal through a fourth sloped or graded passband filter configured to attenuate an output power of the fourth optical signal in the fourth wavelength band, and transmitting the third and fourth optical signals over the optical fiber, similarly or substantially identically to the method for the two optical signals described above. Each of the four wavelength bands has a center wavelength that differs from the center wavelength in an adjacent wavelength band by at least x nm, and each of the four wavelength bands has a wavelength range of less than the difference between adjacent center wavelengths (e.g., less than x nm). In the case of combining more than two optical signals, an optical multiplexer is used to combine the optical signals. In any of the above-described embodiments of the method, any of the various embodiments of the thermally unregulated light emitting device and/or the sloped or graded passband filter may be used.

In yet another aspect, the present invention relates to a method of making a thermally unregulated light emitting device with a controllable output power, comprising placing the thermally unregulated light emitting device on a mounting surface, and placing a sloped or graded passband filter between the thermally unregulated light emitting device and the target. The thermally unregulated light emitting device is configured to (i) receive a bias current less than or equal to a maximum bias current limit and (ii) emit an optical signal within a wavelength band towards a target. The thermally unregulated light emitting device also has a maximum operating temperature limit and maximum and minimum output power limits. The sloped or graded passband filter is configured to attenuate an output power of the optical signal in the wavelength band, and has an insertion loss in the wavelength band that decreases as (i) a temperature of the thermally unregulated light emitting device increases and/or (ii) a wavelength of the optical signal increases within the wavelength band, such that the attenuated optical signal is within the maximum and minimum output power limits when (1) the bias current is at or below the maximum bias current limit and (2) the thermally unregulated light emitting device emits the optical signal at or below the maximum operating temperature limit.

The method of making may further comprise (i) placing one or more lenses on a same or different mounting surface, the lens(es) being configured to focus the optical signal onto a same or different target; (ii) adhering the thermally unregulated light emitting device, the sloped or graded passband filter, and (when present) the lens(es) to the mounting surface(s); and/or (iii) aligning the thermally unregulated light emitting device, the sloped or graded passband filter, and (when present) the lens(es) so that the attenuated optical signal (which may be focused) has a maximum output power, intensity or signal strength at a predetermined target.

As described above, any of the various embodiments of the optical or optoelectronic transmitter or components thereof (e.g., the thermally unregulated light emitting device, the sloped or graded passband filter, etc.) may be used, made or assembled in the present method of making. For example, when the thermally unregulated light emitting device comprises a DML or an EML, the method may further comprise placing a laser driver configured to provide a driver and/or data signal to the DML on a same or different mounting surface and optionally adhering the laser driver to the mounting surface.

The present optical or optoelectronic transmitter and methods enable DMLs and other lasers without active temperature control mechanisms to output an optical signal at a power or signal strength within specified or predetermined upper and lower limits, using a bias current within specified or predetermined upper and lower limits, while operating the DML or other laser within allowable temperature limits. These and other features and advantages of the present invention will become readily apparent from the detailed description of various embodiments below.

DETAILED DESCRIPTION

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures and components have not been described in detail so as not to unnecessarily obscure aspects of the present invention. Furthermore, it should be understood that the possible permutations and combinations described herein are not meant to limit the invention. Specifically, variations that are not inconsistent may be mixed and matched as desired.

For the sake of convenience and simplicity, the terms "transceiver," "optical transceiver" and "optoelectronic transceiver" may be used interchangeably, as may the terms "optical" and "optoelectronic," the terms "connected to," "coupled with," "coupled to," and "in communication with" (which include both direct and indirect connections, couplings and communications), the terms "mounting," "affixing," "attaching" and "securing" (and grammatical variations thereof), and the terms "data," "information" and "bit(s)," but these terms are generally given their art-recognized meanings.

The term "length" generally refers to the largest dimension of a given 3-dimensional structure or feature. The term "width" generally refers to the second largest dimension of a given 3-dimensional structure or feature. The term "thickness" generally refers to a smallest dimension of a given 3-dimensional structure or feature. The length and the width, or the width and the thickness, may be the same in some cases. A "major surface" refers to a surface defined by the two largest dimensions of a given structure or feature, which in the case of a structure or feature having a circular surface, may be defined by the radius of the circle.

Figure 7:
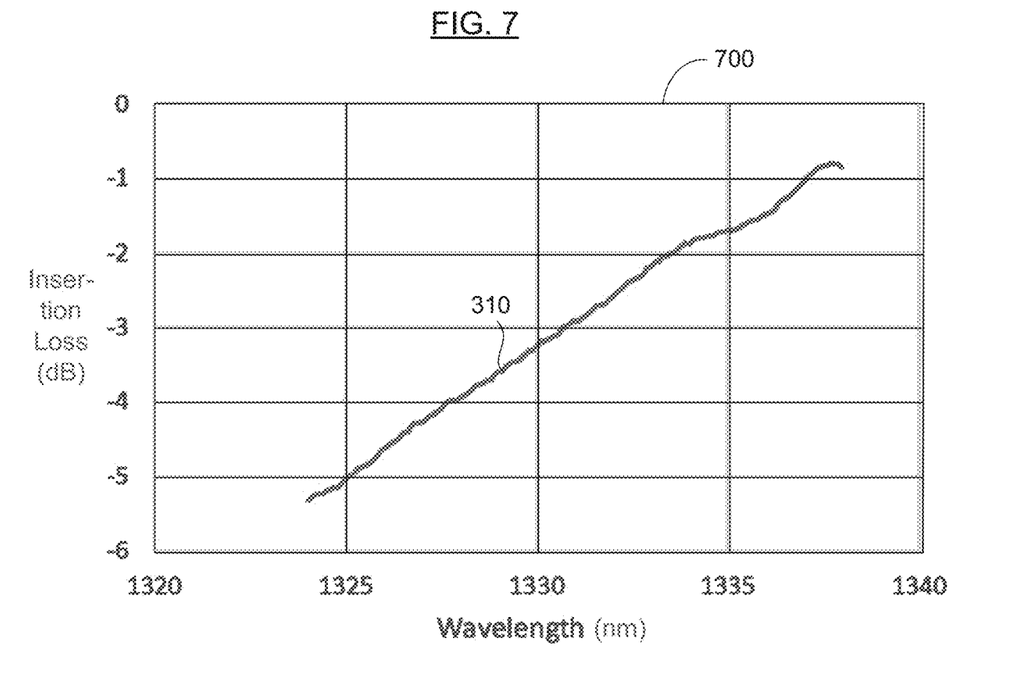
FIG. 7 is a graph showing the insertion loss of a sloped or gradient passband filter on passing through the filter, in accordance with one or more embodiments of the present invention.

The present invention meets the need for a solution that enables DMLs and other lasers without active temperature control mechanisms to output an optical signal at a power within specified upper and lower limits, using a bias current within the specified upper and lower limits, while operating the DML or other laser within allowable temperature limits. FIG. 7 is a graph 700 showing the insertion loss of a sloped or gradient passband filter on light passing through the filter, in accordance with one or more embodiments of the present invention. From about 1324 nm to about 1338 nm, the line 710 shows that transmission of light through the filter increases linearly or substantially linearly as the wavelength increases. For example, a straight line fitted to the actual insertion loss data in the line 710 follows the equation y=0.33x−441.4, where y is the insertion loss (in dB) and x is the wavelength. The insertion loss range of about −5.2 dB (at 1324 nm) to −0.8 dB (at 1338 nm) nearly ideally offsets or complements the output power loss of a conventional DML over the same wavelength range when light is emitted from the conventional DML within the usable range of bias current that can be applied to the conventional DML. Thus, the present invention utilizes the properties and/or characteristics of the DML in which the wavelength of the emitted light red-shifts when the temperature increases to allow a greater amount of light through the filter as the temperature increases.

An Exemplary Optical Transmitter

Figure 8:
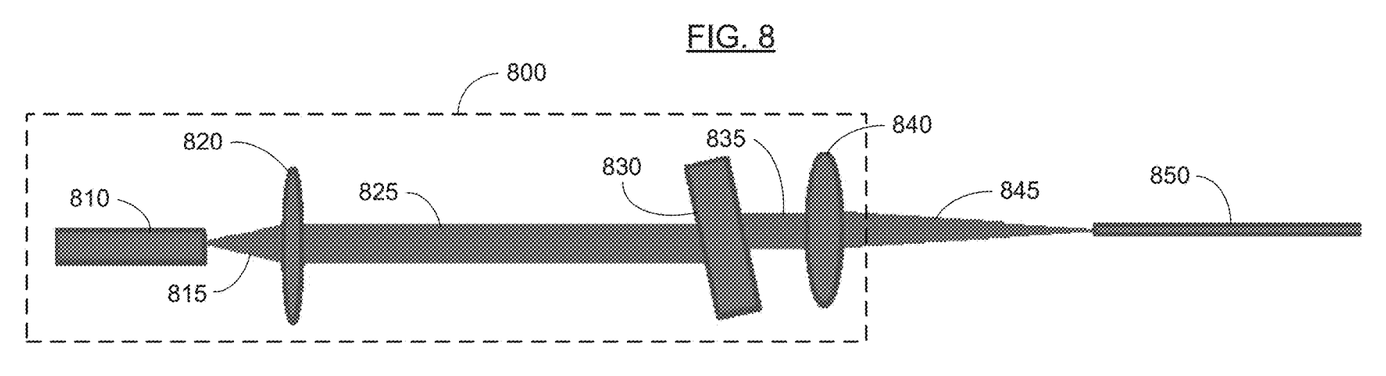
FIG. 8 is a block diagram of an exemplary optical transmitter including a DML and a sloped or gradient passband filter, in accordance with one or more embodiments of the present invention.

FIG. 8 shows an exemplary optical transmitter 800, including a thermally unregulated laser 810, a first lens 820, a sloped or gradient passband filter 830, and a second lens 840. The optical transmitter 800 emits and focuses an optical signal 845 onto an end of an optical fiber 850. The components of the optical transmitter 800 are typically found in a transmitter optical subassembly (TOSA).

In operation, the laser 810 emits a modulated optical signal 815, and the first lens 820 focuses the modulated optical signal 815 onto a target. The laser 810 may comprise any laser or laser diode that is not thermally regulated, such as a DML or an electrically modulated laser (EML) without a cooling mechanism (e.g., a thermoelectric cooler) in thermal communication with the laser. For example, the laser 810 may comprise a laser diode and, optionally, a polarizer (e.g., to emit polarized and/or coherent light), an optical isolator and/or an external modulator. The external modulator may be electrical, optical, acoustic, or a combination thereof. The laser diode may be or comprise a double heterostructure laser, a separate confinement heterostructure laser, a quantum well laser, a quantum cascade laser, an interband cascade laser, a distributed Bragg reflector laser, a distributed feedback laser, a vertical cavity laser, a vertical-cavity surface-emitting laser [VCSEL], a vertical external-cavity surface-emitting laser [VECSEL], an external-cavity diode laser, or other device that converts an electrical current or signal into light.

The first lens 820 may comprise any type or shape of lens, such as a ball lens, a half-ball or other planoconvex lens, a biconvex ("cat's eye") lens, a positive meniscus lens, an achromatic lens, a Fresnel lens, a gradient index (GRIN) lens, etc. The target of the first lens 820 may be a surface of the filter 830, a surface of a mirror or beam combiner (see, e.g., FIG. 10 and the discussion thereof), an end of or a focal spot in the optical fiber 850 (e.g., in the absence of the second lens 840), etc.

The at least partially-focused modulated optical signal 825 passes through the filter 830, which filters different wavelengths of light by different amounts (e.g., with different insertion losses). The sloped or gradient passband filter 830 may comprise, for example, a gain flattening filter, such as those conventionally used with erbium-doped fiber amplifiers (EDFAs). Suitable gain flattening filters are commercially available from Iridian Spectral Technologies Ltd. (Ottawa, Ontario, Canada), Auxora, Inc. (Duarte, Calif. and Shenzhen, China), and Lumentum Operations LLC (Milpitas, Calif.). Such gain flattening filters can also be customized to meet or approximate a desired insertion loss curve at a certain or predetermined center wavelength or wavelength band. When manufactured in high volumes, the cost of gain flattening filters can approach conventional passband filters.

Figure 9:
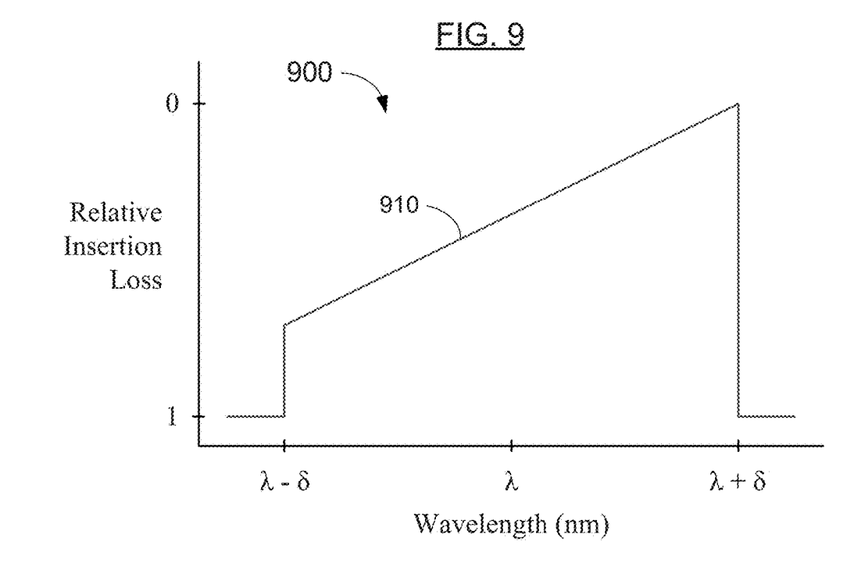
FIG. 9 is a graph showing the insertion loss of an ideal sloped or gradient filter as a function of wavelength, in accordance with one or more embodiments of the present invention.

FIG. 9 is a graph 900 showing an exemplary ideal relative insertion loss curve 910 for the sloped or gradient passband filter 830 of FIG. 8 as a function of wavelength. Below a first predetermined wavelength $\lambda-\delta$, the ideal relative insertion loss is 1. In other words, no light having a wavelength below the first predetermined wavelength passes through the filter 830. At the first predetermined wavelength, the ideal relative insertion loss is relatively high, but less than 1 (e.g., from about 0.5 to about 0.8). As the wavelength of the light increases up to a second predetermined wavelength $\lambda+\delta$, the ideal relative insertion loss decreases to a relative value approaching 0 (e.g., of about 0.2 to 0.0) at the second predetermined wavelength. Preferably, the decrease in relative insertion loss is linearly or substantially linear from the first predetermined wavelength to the second predetermined wavelength. Above the second predetermined wavelength, the ideal relative insertion loss is 1 (e.g., no light having a wavelength above the second predetermined wavelength passes through the filter 830).

Taking into account the typical allowable TOSA optical output signal strengths in various applications of optical transmitters, a filter 830 that attenuates the output of the laser 810 by about 2-10 dB (or any value or range of values therein, such as 4-6 dB) for each 10-15 nm in the wavelength range from the second predetermined wavelength to the first predetermined wavelength offsets the typical decrease in output power of a laser as a function of temperature (e.g., about 1-3 dB per 10-15° C.), while taking advantage of the laser red-shifting its optical output as a function of temperature (e.g., about 1-1.5 nm per 10-15° C.).

Referring back to FIG. 8, the filtered optical signal 835 is refocused by the second lens 840 onto a target at or in the end of the optical fiber 850. Thus, a current can be applied to a thermally unregulated laser 810 within allowable operating current limits (see curve 610 in graph 600 of FIG. 6), and even though the laser 810 (FIG. 8) emits light at a power that exceeds the upper power limit in the lowermost range of allowable operating temperatures (see curve 660 in graph 650 of FIG. 6), the emitted light has a wavelength that can be relatively highly attenuated at low temperatures, but attenuated only slightly at relatively high temperatures. Similarly, if the laser 810 emits light at a power below the lower power limit in the uppermost range of allowable operating temperatures, the bias current applied to the laser 810 may slightly exceed the allowable upper current limit (or the upper current limit may be slightly increased) to the extent necessary for the emitted light at relatively high temperatures to be at or above the minimum output power limit, even when the light is slightly attenuated by the sloped or gradient passband filter 830.

Figure 10:
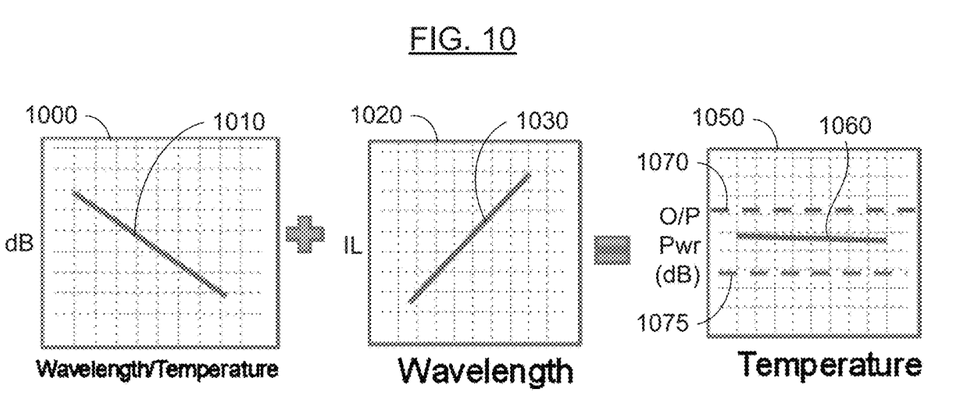
FIG. 10 is a block diagram of an exemplary multi-channel optical transmitter including multiple DML-filter pairs and n optical multiplexer, in accordance with one or more embodiments of the present invention.

FIG. 10 includes three graphs 1000, 1020 and 1050, respectively showing the output power of light emitted by a thermally unregulated laser as a function of temperature in line 1010, the insertion loss of a sloped or gradient passband filter as a function of wavelength in line 1030, and the output power of light emitted by the thermally unregulated laser and filtered by the sloped or gradient passband filter as a function of temperature in line 1060. Upper and lower limits for the output power are shown by lines 1070 and 1075 in graph 1050. The output power of light emitted by the thermally unregulated laser and filtered by the sloped or gradient passband filter stays within the upper and lower limits 1070 and 1075.

Six (6) prototype optical transmitters were made in accordance with the design shown in FIG. 8. In the prototype transmitters, the laser 810 emitted light at a center wavelength of 1331 nm at room temperature. The wavelength of the emitted light red-shifted to about 1336 nm at 70° C., while at the same time, the output power of the emitted light decreased by about 3 dB at constant current. The emitted light was passed through a sloped/gradient passband filter having a relative insertion loss of about 0.75 at 1329 nm and nearly zero at 1337.5 nm (the actual insertion loss at 1337.5 nm was 0.5 dB), and the slope of the insertion loss as a function of wavelength in the 1329-1337.5 nm range was approximately linear (i.e., the peak-to-peak error function of the filter was <0.4 dB). The output power of each of the six prototype optical transmitters was within standard upper and lower limits (i.e., a range of about 10 dB) over the entire temperature range of 10-70° C.

An Exemplary Multi-Channel Optical Transmitter

Figure 11:
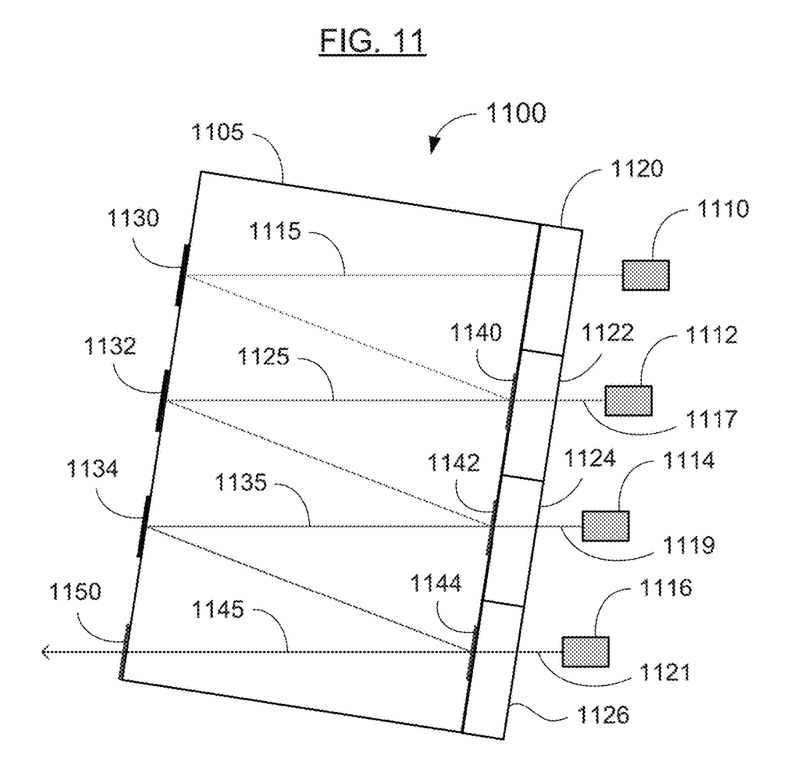
FIG. 11 is a diagram showing an exemplary multi-channel optical or optoelectronic transmitter, in accordance with the present invention.

FIG. 11 is a diagram showing an exemplary multi-channel optical or optoelectronic transmitter 1100, including an optically transparent multiplexer block 1105, first through fourth thermally unregulated lasers 1110, 1112, 1114 and 1116, first through fourth sloped or gradient passband filters 1120, 1122, 1124 and 1126, first through third high-reflectance mirrors 1130, 1132 and 1134, first through third beam combiners 1140, 1142 and 1144, and an optional anti-reflective coating 1150. Each of the lasers 1110, 1112, 1114 and 1116 may comprise a laser diode as described herein (e.g., a DML or thermally unregulated EML). The exemplary multi-channel optical or optoelectronic transmitter 1100 may be useful in a wave-division multiplexing (WDM) optical system or network, and may have a bandwidth of 40 GHz, 100 GHz, 400 GHZ, or more. The WDM optical system or network may comprise a coarse WDM (CWDM) optical system or network, a dense WDM (DWDM) optical system or network, or other WDM optical system or network.

In operation, the first laser 1110 emits a first optical signal 1115 at a first center wavelength $\lambda_1$. The first optical signal 1115 passes through the first sloped or gradient passband filter 1120, which attenuates the first optical signal 1115 linearly or substantially linearly with temperature and/or difference from the center wavelength $\lambda_1$, as described herein. In other words, the first sloped or gradient passband filter 1120 attenuates the first optical signal 1115 by the greatest amount at the lowest operating temperature and/or at the smallest wavelength (i.e., at which the optical output power of the first laser 1110 is highest). As the temperature of the first laser 1110 increases, the wavelength of the first optical signal 1115 increases, the output power of the first laser 1110 decreases, and the first sloped or gradient passband filter 1120 attenuates the first optical signal 1115 by a smaller amount, generally in proportion (e.g., linearly or substantially linearly) to the increase in the temperature of the first laser 1110.

The attenuated first optical signal 1115 is reflected by the first high-reflectance mirror 1130 (e.g., by total reflection). Thus, the first high-reflectance mirror 1130 may be or comprise a total reflection mirror (e.g., a thin metal coating on a predefined area of the surface of the optically transparent multiplexer block 1105). The attenuated first optical signal 1115 is reflected towards a first target, in this case a point on the surface of the first beam combiner 1140 from which an attenuated second optical signal 1117 emerges.

The second laser 1112 emits a second optical signal 1117 at a second center wavelength $\lambda_2$. The second center wavelength $\lambda_2$ generally differs from the first center wavelength $\lambda_1$, typically by a minimum of 4-20 nm. Otherwise, the second laser 1112 is identical or substantially identical to the first laser 1110, although variations between the first and second lasers 1110 and 1112 are possible. The second optical signal 1117 passes through the second sloped or gradient passband filter 1122, which attenuates the second optical signal 1117 in the same or substantially the same manner as the first sloped or gradient passband filter 1120. Both attenuated optical signals 1115 and 1117 are within allowable laser output power limits.

The first beam combiner 1140 combines the reflected first optical signal 1115 with the attenuated second optical signal 1117, thereby forming a first combined signal 1125. The first beam combiner 1140 generally is or comprises a coating on the surface of either the optically transparent multiplexer block 1105 or the second sloped or gradient passband filter 1122. The coating is transparent or substantially transparent to light within a predetermined wavelength band (typically including the wavelength $\lambda_2$) and reflective (e.g., totally reflective) to light outside the predetermined wavelength band (typically including the center wavelength $\lambda_1$).

The first combined signal 1125 is then reflected by the second high-reflectance mirror 1132 (e.g., by total reflection). Thus, the second high-reflectance mirror 1132 may also be or comprise a total reflection mirror and may be identical or substantially identical to the first high-reflectance mirror 1130. The second high-reflectance mirror 1132 is on the same surface of the multiplexer block 1105 as the first high-reflectance mirror 1130, but in a different, non-overlapping location (e.g., opposite from the first beam combiner 1140 and/or the second sloped or gradient passband filter 1122). The first combined signal 1125 is reflected towards a second target, in this case a point on the surface of the second beam combiner 1142 from which an attenuated third optical signal 1119 emerges.

The third laser 1114 emits a third optical signal 1119 at a third center wavelength $\lambda_3$. The third center wavelength $\lambda_3$ generally differs from the first and second center wavelengths $\lambda_1$ and $\lambda_2$, typically by a minimum of 4-20 nm from the second center wavelength $\lambda_2$ and twice the minimum from the first center wavelength $\lambda_1$. Otherwise, the third laser 1114 is identical or substantially identical to the first and second lasers 1110 and 1112, although variations among the first, second and third lasers 1110, 1112 and 1114 are possible. The third optical signal 1119 passes through the third sloped or gradient passband filter 1124, which attenuates the third optical signal 1119 in the same or substantially the same manner as the first and second sloped or gradient passband filters 1120 and 1122. All three attenuated optical signals 1115, 1117 and 1119 are within allowable laser output power limits.

The second beam combiner 1142 combines the reflected first combined signal 1125 with the attenuated third optical signal 1119, thereby forming a second combined signal 1135. Similar to the first beam combiner 1140, the second beam combiner 1142 generally is or comprises a coating on the surface of either the optically transparent multiplexer block 1105 or the third sloped or gradient passband filter 1124. When the second beam combiner 1142 is on the surface of the optically transparent multiplexer block 1105, it is in a predetermined location or area different from (and non-overlapping with) that of the first beam combiner 1140. The coating is transparent or substantially transparent to light within a predetermined wavelength band (typically including the wavelength $\lambda 3$) and reflective (e.g., totally reflective) to light outside the predetermined wavelength band (typically including the center wavelengths $\lambda_1$ and $\lambda_2$).

The second combined signal 1135 is then reflected by the third high-reflectance mirror 1134 (e.g., by total reflection). Thus, the third high-reflectance mirror 1134 may also be or comprise a total reflection mirror and may be identical or substantially identical to the first and/or second high-reflectance mirrors 1130 and 1132. The third high-reflectance mirror 1134 is on the same surface of the multiplexer block 1105 as the first and second high-reflectance mirrors 1130 and 1132, but in a different, non-overlapping location (e.g., opposite from the second beam combiner 1142 and/or the third sloped or gradient passband filter 1124). The second combined signal 1135 is reflected towards a third target, in this case a point on the surface of the third beam combiner 1144 from which an attenuated fourth optical signal 1121 emerges.

The fourth laser 1114 emits a fourth optical signal 1119 at a fourth center wavelength $\lambda_4$. The fourth center wavelength $\lambda_4$ generally differs from the first, second and third center wavelengths $\lambda_1$, $\lambda_2$ and $\lambda_3$, typically by a minimum of 4-20 nm from the third center wavelength $\lambda_3$, twice the minimum from the second center wavelength $\lambda_2$, and three times from the first center wavelength $\lambda_1$. Otherwise, the fourth laser 1116 is identical or substantially identical to the first, second and third lasers 1110, 1112 and 1114, although variations among the first, second, third and fourth lasers 1110, 1112, 1114 and 1116 are possible. The fourth optical signal 1121 passes through the fourth sloped or gradient passband filter 1126, which attenuates the fourth optical signal 1121 in the same or substantially the same manner as the first, second and third sloped or gradient passband filters 1120, 1122 and 1124. All four attenuated optical signals 1115, 1117, 1119 and 1121 are within allowable laser output power limits.

The third beam combiner 1144 combines the reflected second combined signal 1135 with the attenuated fourth optical signal 1121, thereby forming a third combined signal 1145. Similar to the first and second beam combiners 1140 and 1142, the third beam combiner 1144 generally is or comprises a coating on the surface of either the optically transparent multiplexer block 1105 or the fourth sloped or gradient passband filter 1126. When the third beam combiner 1144 is on the surface of the optically transparent multiplexer block 1105, it is in a predetermined location or area different from (and non-overlapping with) those of the first and second beam combiners 1140 and 1142. The coating is transparent or substantially transparent to light within a predetermined wavelength band (typically including the wavelength $\lambda_4$) and reflective (e.g., totally reflective) to light outside the predetermined wavelength band (typically including the center wavelengths $\lambda_1$, $\lambda_2$ and $\lambda_3$).

The third combined signal 1145 is directed to a fourth target, such as a point on a focusing lens (not shown), or at or in an end of an optical fiber (also not shown). The third combined signal 1145 may pass through the optional anti-reflective coating 1150 prior to being focused by the focusing lens or entering the optical fiber. The anti-reflective coating 1150 may be or comprise a conventional anti-reflective coating on the same surface of the multiplexer block 1105 as the first, second and third high-reflectance mirrors 1130, 1132 and 1134, but in a different, non-overlapping location (e.g., opposite from the third beam combiner 1144 and/or the fourth sloped or gradient passband filter 1126).

In the four-channel optical transmitter 1100 shown in FIG. 11, each of the four center wavelengths $\lambda_1$, $\lambda_2$, $\lambda_3$ and $\lambda_4$ (e.g., the wavelength of light emitted at ambient temperature, or about 25° C.) may differ from an adjacent center wavelength by at least 4 nm (e.g., 4-20 nm). For example, when each center wavelength differs from an adjacent center wavelength by 20 nm, the allowable variation in the wavelength of emitted light ($\delta$; see, e.g., FIG. 2 and the discussion thereof supra) may be less than ±10 nm or any maximum variation of less than 10 nm (e.g., ±8 nm, ±6.5 nm, etc.). When each center wavelength differs from an adjacent center wavelength by less than 20 nm (e.g., 8 nm, 4 nm, etc.), the allowable variation in the wavelength of emitted light $\delta$ may scale appropriately. For example, $\delta$ may be <4 nm (e.g., ±2.5 nm) when each center wavelength differs from an adjacent center wavelength by 8 nm, and $\delta$ may be <2 nm (e.g., ±1.5 nm) when each center wavelength differs from an adjacent center wavelength by 4 nm. The temperature at which the center wavelength is determined may be increased as the difference between adjacent center wavelengths decreases. For example, if the operating temperature range is 10-70° C. or 0-80° C., the laser can be designed so that the center wavelength is at 40° C. in such a case, the sloped passband filter may be non-linear (e.g., have a negative second derivative) at wavelengths below the center wavelength.

Exemplary Methods of Controlling the Output Power of a Laser

In a further aspect, the present invention also relates to a method of controlling an output power of a thermally unregulated light emitting device. The method comprises generating an optical signal within a wavelength band from the thermally unregulated light emitting device, and passing the optical signal through a sloped or graded passband filter configured to attenuate an output power of the optical signal in the wavelength band. In multi-channel versions of the method, the thermally unregulated light emitting device, the optical signal, the wavelength band and the sloped or graded passband filter may be a first thermally unregulated light emitting device, a first (optical) output signal, a first wavelength band and a first sloped or graded passband filter, respectively. As for the optical or optoelectronic transmitter, the light emitting device (i) is configured to receive a bias current less than or equal to a maximum bias current limit and (ii) has a maximum operating temperature limit and maximum and minimum output power limits. The sloped or graded passband filter has an insertion loss in the wavelength band that decreases as (i) a temperature of the thermally unregulated light emitting device increases and/or (ii) a wavelength of the optical signal increases within the wavelength band. As a result of these properties and/or parameters of the thermally unregulated light emitting device and the sloped or graded passband filter, the attenuated optical signal is within the maximum and minimum output power limits when (1) the bias current is at or below the maximum bias current limit and (2) the thermally unregulated light emitting device outputs the optical signal at or below the maximum operating temperature limit.

The thermally unregulated light emitting device may also have a minimum bias current limit and/or a minimum operating temperature limit. In such cases, passing the optical signal through the sloped or graded passband filter attenuates the optical signal to a value within the maximum and minimum output power limits when (1) the bias current is at or above the minimum bias current limit (in addition to the bias current being at or below the maximum bias current limit) and (2) the thermally unregulated light emitting device outputs the optical signal at or above the minimum operating temperature limit (in addition to the light emitting device outputting the optical signal at or below the maximum operating temperature limit).

As described for the present optical or optoelectronic transmitter, the wavelength band may have a center wavelength $\lambda$ and a range of from $(\lambda-\delta)$ to $(\lambda+\delta)$, and the insertion loss in the (first) wavelength band may decrease linearly or substantially linearly from $(\lambda-\delta)$ to $(\lambda+\delta)$. Alternatively, the insertion loss of the sloped or graded passband filter may decrease non-linearly (e.g., logarithmically) at the lowermost end of the wavelength range (e.g., from $(\lambda-\delta)$ to $\lambda$, from $(\lambda-\delta)$ to $(\lambda-[\delta/2])$, etc.). The center wavelength $\lambda$ may be from 440 to 2000 nm, or any value or range of values therein. For example, the center wavelength $\lambda$ may be in a commonly-used band of light for optical communications, such as infrared (IR) light (e.g., at or about 850 nm, 1310 nm, 1331 nm, 1550 nm, 1552.5 nm, 1620 nm or another value in the range 1270-1625 nm, etc.). The variation $\delta$ from the center wavelength $\lambda$ may be from 1 to 25 nm, or any value or range of values therein in single-transmitter devices.

As for the present optical or optoelectronic transmitter, the thermally unregulated light emitting device may comprise a laser diode, in which case the method may further comprise converting an electrical current or an electrical signal into light using the laser diode. The laser diode may be as described above for the optical or optoelectronic transmitter. The light emitted by the laser diode becomes the optical signal after passing through any polarizer, optical isolator and/or lens that may be present between the laser diode and the sloped or graded passband filter.

In some embodiments, the thermally unregulated light emitting device may comprise a directly-modulated laser diode (DML). Alternatively, the thermally unregulated light emitting device may further comprise an external modulator, and the combination of the laser diode and the external modulator may comprise an electromodulated laser (EML). In such embodiments, the method may further comprise providing an electrical driver and/or data signal from a laser driver to the DML or EML, and optionally, providing the electrical data signal to the laser driver (in which case, the laser driver provides an electrical driver signal to the DML or EML). In the case where the thermally unregulated light emitting device comprises a laser diode-external modulator combination such as the EML, the method may further comprise modulating the light emitted from the laser diode using the external modulator and/or providing the electrical driver and/or data signal from the laser driver to the modulator.

In further embodiments, the method may further comprise generating the bias current and providing the bias current to the thermally unregulated light emitting device. For example, the bias current may be generated by a bias circuit in electrical communication with the light emitting device. In other or even further embodiments, the method may further comprise passing the output signal (or the modulated output signal) through a polarizer, thereby polarizing or specifying a polarization type for the (modulated) output signal. In embodiments involving a polarized output signal, the method may further comprise (i) passing the output signal (or the modulated output signal) through an optical isolator and/or (ii) reducing or preventing a reflection of the optical signal from impinging on the light emitting device using an optical isolator. The optical isolator may comprise a polarization filter and one or more waveplates configured to rotate the polarization angle of the output signal in the same direction (e.g., + or −), regardless of the direction in which the output signal travels.

Additionally or alternatively, the method may further comprise passing the output signal (or the modulated output signal) through one or more lenses configured to focus the optical signal onto a target (e.g., in or on an end of an optical fiber). For example, prior to attenuating the (modulated) output signal with the sloped or gradient passband filter, the (modulated) output signal may be passed through (i) a first lens configured to focus the (modulated) output signal on a first target and/or (ii) a second lens configured to focus the attenuated output signal on a second target. The first target may be a surface of the sloped or gradient passband filter or a surface of a beam combiner on the (outer) surface of the sloped or gradient passband filter, etc. The second target may be a location in or on an end of an optical transmission medium (e.g., an optical fiber). In substantially all embodiments, the method may further comprise transmitting the modulated, attenuated optical signal over the optical transmission medium.

In even further embodiments, the method may further comprise (i) generating a second optical signal within a second wavelength band from a second thermally unregulated light emitting device and (ii) passing the second optical signal through a second sloped or graded passband filter configured to attenuate an output power of the second optical signal in the second wavelength band, similarly or substantially identically to the method described above for the (first) optical signal from the (first) light emitting device, and transmitting the first and second optical signals over output an optical fiber. The second optical signal in the second wavelength band represents a second channel of optical communication (e.g., from a single, multi-channel transmitter or other device including such a transmitter). As for the optical or optoelectronic transmitter, the center wavelengths of the first and second optical signals differ by a predetermined minimum (e.g., x nm), and the first and second wavelength bands do not overlap. Thus, the variation δ from the center wavelength λ in each wavelength band is less than x/2.

In such multi-channel embodiments, the method may further comprise combining the first and second optical signals (e.g.,) prior to transmitting the first and second optical signals over the optical fiber. When the method involves two channels, the first and second optical signals may be combined using a beam combiner. When the method involves two channels, the optical signals may be combined using an optical multiplexer.

Some embodiments of the method may further comprise (i) generating a third optical signal within a third wavelength band from a third thermally unregulated light emitting device, (ii) passing the third optical signal through a third sloped or graded passband filter configured to attenuate an output power of the third optical signal in the third wavelength band, (iii) generating a fourth optical signal within a fourth wavelength band from a fourth thermally unregulated light emitting device, (iv) passing the fourth optical signal through a fourth sloped or graded passband filter configured to attenuate an output power of the fourth optical signal in the fourth wavelength band, and transmitting the third and fourth optical signals over the optical fiber, similarly or substantially identically to the method for the first and second optical signals described above. Each of the four wavelength bands has a center wavelength that differs from the center wavelength in an adjacent wavelength band by at least x nm, and each of the four wavelength bands has a wavelength range of less than the difference between adjacent center wavelengths (e.g., less than x nm). As described above, an optical multiplexer may be used to combine the four optical signals.

In any of the above-described embodiments of the method, any of the various embodiments of the optical or optoelectronic transmitter or of any component(s) thereof (e.g., the thermally unregulated light emitting device and/or the sloped or graded passband filter) may be used. Thus, any substitution or variation of any embodiment of the optical or optoelectronic transmitter or any component(s) thereof may be combined with the present method of controlling the output power of an optical signal.

An Exemplary Method of Making an Optical Transmitter

In yet another aspect, the present invention relates to a method of making a thermally unregulated light emitting device with a controllable output power, comprising placing the thermally unregulated light emitting device on a mounting surface, and placing a sloped or graded passband filter between the thermally unregulated light emitting device and the target. As for the optical or optoelectronic transmitter and method above, the thermally unregulated light emitting device is configured to (i) receive a bias current less than or equal to a maximum bias current limit and (ii) emit an optical signal within a wavelength band towards a target. The thermally unregulated light emitting device also has a maximum operating temperature limit and maximum and minimum output power limits. The sloped or graded passband filter is configured to attenuate an output power of the optical signal in the wavelength band, and has an insertion loss in the wavelength band that decreases as (i) a temperature of the thermally unregulated light emitting device increases and/or (ii) a wavelength of the optical signal increases within the wavelength band, such that the attenuated optical signal is within the maximum and minimum output power limits when (1) the bias current is at or below the maximum bias current limit and (2) the thermally unregulated light emitting device emits the optical signal at or below the maximum operating temperature limit.

The mounting surface(s) may be or comprise a circuit board (e.g., a PCB), one or more surfaces or a device mounting structures in a transmitter optical subassembly (TOSA), etc. For example, the light emitting device, an optional polarizer, an optional optical isolator, and a lens may be mounted on a device mounting structure in a TOSA to enable more facile alignment and/or an increase in the alignment yield.

The method of making may further comprise placing one or more lenses on a same or different mounting surface (as described for the method of controlling the output power of a thermally unregulated light emitting device above). The lens(es) may be configured to focus the optical signal onto a target, as described for the method of controlling the output power of a thermally unregulated light emitting device above.

Any of the devices placed on a mounting surface may be adhered to the mounting surface on which it is placed. Electrically conductive devices may be adhered using a solder and/or a conductive adhesive. Non-electrically conductive devices may be adhered using an electrically insulative adhesive, such as an epoxy or a UV adhesive (i.e., an adhesive that is activated or cured using ultraviolet [UV] light). Thus, the thermally unregulated light emitting device may be adhered to its mounting surface at least in part using a solder and/or a conductive adhesive, or when the light emitting device is mounted onto a surface not having electrical contacts for electrical signals to be transmitted to the light emitting device, an electrically insulative adhesive may be used. Furthermore, the sloped or graded passband filter and, when present, the lens(es) may be mounted to their respective mounting surface(s) using an electrically insulative adhesive.

In some embodiments, the method further comprises aligning the thermally unregulated light emitting device, the sloped or graded passband filter, and (when present) the lens(es), the polarizer, and/or the optical isolator so that the attenuated optical signal (which may be focused by one or more of the lens[es]) has a maximum output power, intensity or signal strength at a predetermined target. In such embodiments, a UV adhesive may be advantageously used to align the components of the optical or optoelectronic transmitter prior to curing the adhesive (e.g., by irradiating the UV adhesive with UV light).

As described above, any of the various embodiments of the optical or optoelectronic transmitter or components thereof (e.g., the thermally unregulated light emitting device, the sloped or graded passband filter, etc.) may be used, made or assembled in the present method of making. For example, when the thermally unregulated light emitting device comprises a DML or an EML, the method may further comprise placing a laser driver configured to provide a driver and/or data signal to the DML or a modulator of the EML on a same or different mounting surface, and optionally adhering the laser driver to the mounting surface, as described herein.

CONCLUSION/SUMMARY

The foregoing descriptions of specific embodiments of the present invention have been presented for purposes of illustration and description. They are not intended to be exhaustive or to limit the invention to the precise forms disclosed, and obviously many modifications and variations are possible in light of the above teachings. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An optical or optoelectronic transmitter, comprising:
a thermally unregulated light emitting device configured to receive a bias current and output an optical signal within a first wavelength band, wherein the first wavelength band has a center wavelength λ and a range of from (λ−δ) to (λ+δ); and
a sloped or graded passband filter configured to receive the optical signal and attenuate an output power of the optical signal in the first wavelength band, wherein:
the thermally unregulated light emitting device has a maximum bias current limit, a maximum operating temperature limit, and maximum and minimum output power limits, and
the sloped or graded passband filter has an insertion loss in the first wavelength band that decreases as a wavelength of the optical signal increases linearly or substantially linearly within the first wavelength band from (λ−δ) to (λ+δ), such that the attenuated optical signal is within the maximum and minimum output power limits when (1) the bias current is at or below the maximum bias current limit and (2) the thermally unregulated light emitting device outputs the optical signal at or below the maximum operating temperature limit.

2. The optical or optoelectronic transmitter of claim 1, wherein the thermally unregulated light emitting device also has a minimum bias current limit and a minimum operating temperature limit, and the attenuated optical signal is within the maximum and minimum output power limits when (1) the bias current is at or above the minimum bias current limit and (2) the thermally unregulated light emitting device outputs the optical signal at or above the minimum operating temperature limit.

3. The optical or optoelectronic transmitter of claim 1, wherein the thermally unregulated light emitting device comprises a laser diode configured to convert an electrical current or signal into light.

4. The optical or optoelectronic transmitter of claim 3, wherein the laser diode comprises a directly-modulated laser diode (DML).

5. The optical or optoelectronic transmitter of claim 3, wherein the laser diode further comprises a polarizer, an optical isolator and/or an external modulator.

6. The optical or optoelectronic transmitter of claim 3, wherein the laser diode comprises a double heterostructure laser, a separate confinement heterostructure laser, a quantum well laser, a quantum cascade laser, an interband cascade laser, a distributed Bragg reflector laser, a distributed feedback laser, a vertical cavity laser, a vertical-cavity surface-emitting laser [VCSEL], a vertical external-cavity surface-emitting laser [VECSEL], or an external-cavity diode laser.

7. The optical or optoelectronic transmitter of claim 1, further comprising one or more lenses configured to focus the optical signal onto a target.

8. A multi-channel optical or optoelectronic transmitter, comprising:

a) optical or optoelectronic transmitter of claim 1, functioning as a first transmitter unit, wherein the optical signal is a first optical signal having a first center wavelength within the first wavelength band;
b) a second transmitter unit similar or substantially identical to the first transmitter unit, configured to output a second optical signal having a second center wavelength within a second wavelength band; and
c) an optical fiber configured to receive the first and second optical signals.

9. The multi-channel optical or optoelectronic transmitter of claim 8, further comprising:
a) a third transmitter unit similar or substantially identical to the first and second transmitter units, configured to output a third optical signal having a third center wavelength within a third wavelength band; and
b) a fourth transmitter unit similar or substantially identical to the first, second and third transmitter units, configured to output a fourth optical signal having a fourth center wavelength within a fourth wavelength band,
wherein each of the first, second, third and fourth center wavelengths differ from an adjacent one of the first, second, third and fourth center wavelengths by x nm, where x is a number of at least 4, and each of the first, second, third and fourth wavelength bands have a wavelength range of less than x nm.

10. The multi-channel optical or optoelectronic transmitter of claim 9, further comprising an optical multiplexer configured to combine the first, second, third and fourth optical signals.

11. The multi-channel optical or optoelectronic transmitter of claim 8, further comprising an optical fiber configured to receive the first and second optical signals.

12. A method of controlling an output power of a thermally unregulated light emitting device, comprising:
generating an optical signal within a wavelength band from the thermally unregulated light emitting device, wherein the light emitting device is configured to receive a bias current less than or equal to a maximum bias current limit, the wavelength band has a center wavelength λ and a range of from (λ−δ) to (λ+δ), and the light emitting device has a maximum operating temperature limit and maximum and minimum output power limits; and
passing the optical signal through a sloped or graded passband filter configured to attenuate an output power of the optical signal in the wavelength band, wherein the sloped or graded passband filter has an insertion loss in the wavelength band that decreases linearly or substantially linearly as a wavelength of the optical signal increases within the wavelength band from (λ−δ) to (λ+δ), such that the attenuated optical signal is within the maximum and minimum output power limits when (1) the bias current is at or below the maximum bias current limit and (2) the thermally unregulated light emitting device outputs the optical signal at or below the maximum operating temperature limit.

13. The method of claim 12, further comprising generating the bias current and providing the bias current to the thermally unregulated light emitting device.

14. The method of claim 12, wherein the laser diode comprises a directly-modulated laser diode (DML), and the method further comprises providing an electrical driver and/or data signal to the DML.

15. A method of making a thermally unregulated light emitting device with a controllable output power, comprising:
- placing the thermally unregulated light emitting device on a mounting surface, wherein the light emitting device is configured to (i) receive a bias current less than or equal to a maximum bias current limit and (ii) emit an optical signal within a wavelength band towards a target, the wavelength band has a center wavelength $\lambda$ and a range of from $(\lambda-\delta)$ to $(\lambda+\delta)$, and the light emitting device has a maximum operating temperature limit and maximum and minimum output power limits; and
- placing a sloped or graded passband filter between the thermally unregulated light emitting device and the target, wherein the sloped or graded passband filter is configured to attenuate an output power of the optical signal in the wavelength band, and the sloped or graded passband filter has an insertion loss in the wavelength band that decreases linearly or substantially linearly as a wavelength of the optical signal increases within the wavelength band from $(\lambda-\delta)$ to $(\lambda+\delta)$, such that the attenuated optical signal is within the maximum and minimum output power limits when (1) the bias current is at or below the maximum bias current limit and (2) the thermally unregulated light emitting device emits the optical signal at or below the maximum operating temperature limit.

16. The method of claim 15, further comprising placing one or more lenses on a same or different mounting surface, the one or more lenses being configured to focus the optical signal onto a same or different target.

17. The method of claim 15, wherein the laser diode comprises a directly-modulated laser diode (DML), and the method further comprises placing a laser driver configured to provide a driver and/or data signal to the DML on a same or different mounting surface.

* * * * *